July 6, 1965 HSIUNG HSU ETAL 3,193,772

TUNABLE TRAVELING WAVE PARAMETRIC AMPLIFIER WITH CONSTANT IDLER FREQUENCY

Filed Feb. 10, 1961 5 Sheets-Sheet 1

INVENTORS:
HSIUNG HSU,
STEPHEN WANUGA,

BY Marvin A. Goldenberg

THEIR ATTORNEY.

INVENTORS:
HSIUNG HSU,
STEPHEN WANUGA,

BY Marvin L. Goldenberg

THEIR ATTORNEY.

INVENTORS:
HSIUNG HSU,
STEPHEN WANUGA,
BY [signature]
THEIR ATTORNEY.

INVENTORS:
HSIUNG HSU,
STEPHEN WANUGA,
BY Manfred Goldenberg
THEIR ATTORNEY.

FIG. 13.
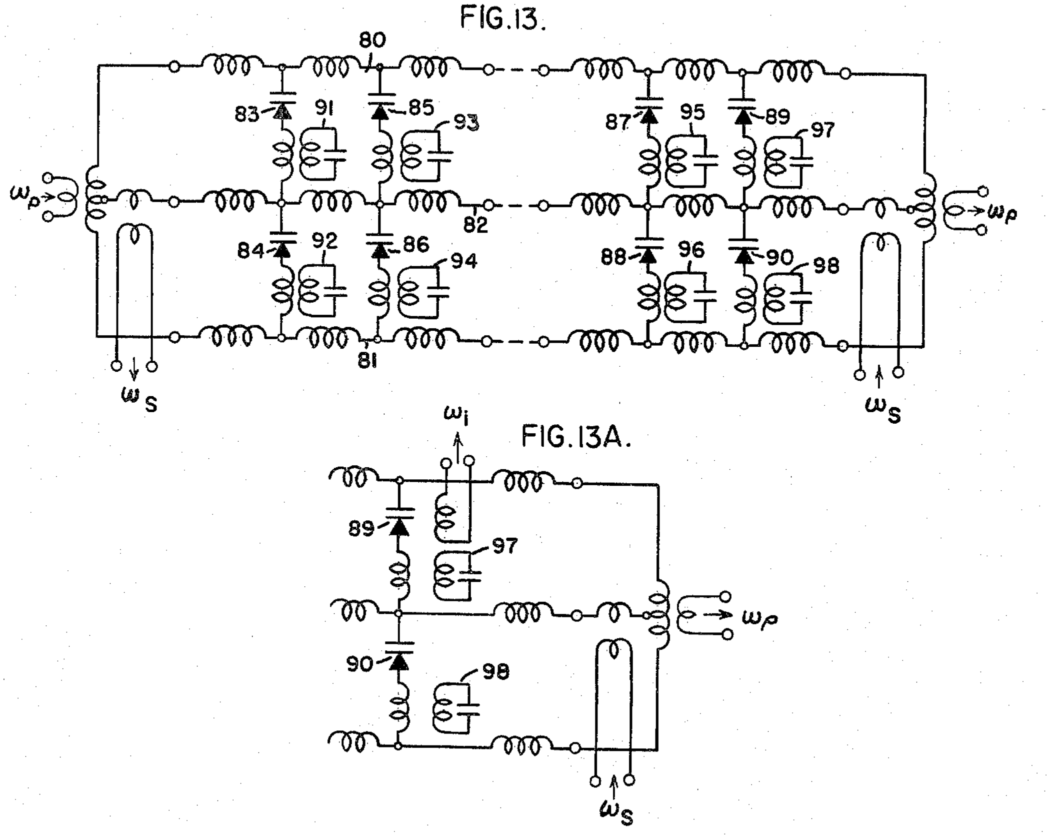
FIG. 13, FIG. 13A.
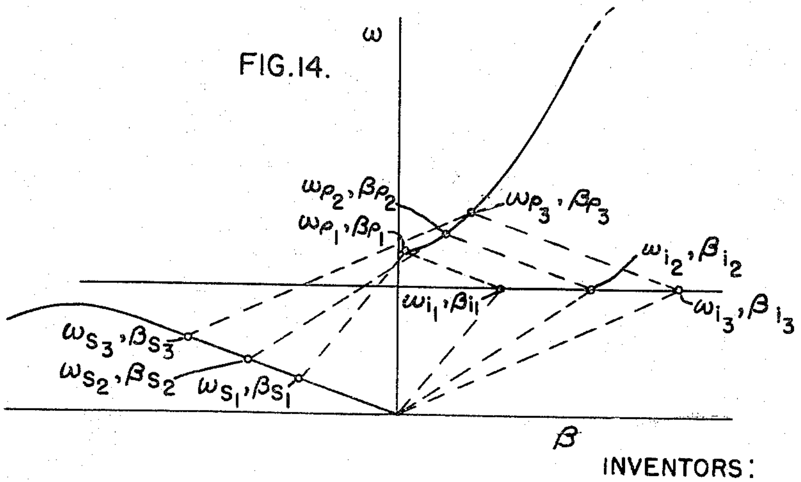
FIG. 14.
INVENTORS:
HSIUNG HSU,
STEPHEN WANUGA,
BY Marvin A. Goldenberg
THEIR ATTORNEY United States Patent Office 3,193,772

Patented July 6, 1965

3,193,772

TUNABLE TRAVELING WAVE PARAMETRIC AMPLIFIER WITH CONSTANT IDLER FREQUENCY

Hsiung Hsu, Clay, and Stephen Wanuga, Liverpool, N.Y., assignors to General Electric Company, a corporation of New York Filed Feb. 10, 1961, Ser. No. 88,535
8 Claims. (Cl. 330—4.6)

The present invention relates to novel tunable parametric amplifiers, and more particularly to traveling wave type parametric amplifiers having a narrow bandwidth and electronically tunable over a wide frequency range.

Parametric amplifiers are well known in the prior art to provide amplification of a high frequency signal of frequency $\omega_s$ by converting power to said signal from a second wave of a higher frequency, termed the pump frequency $\omega_p$. The signal frequency $\omega_s$ and the pump frequency $\omega_p$ are mixed in a nonlinear device. A resonant circuit is provided with said nonlinear device which resonates at the difference frequency of the two applied waves, conventionally termed the idler frequency $\omega_i$. The idler frequency is applied to the nonlinear device and mixed with the pump frequency to again obtain the signal frequency. Since the pump, frequency is greater than the idler and signal waves, the flow of power in the system is from the pump to the idler to the signal wave, in accordance with known Manley-Rowe relations. The flow of power at the idler frequency introduces a negative resistance into the signal circuit so that the signal wave is taken at the output of the nonlinear device as an amplified signal. In the simple standing wave type amplifier, parametric amplification will occur so long as the relationship $\omega_p=\omega_s+\omega_i$ is satisfied. For traveling waves we will see that a second requirement exists.

Recently electronically tunable parametric amplifiers have been developed which employ traveling waves, as opposed to standing waves in cavity type amplifiers. By electronically tunable it is meant that the amplifier is tuned by varying the pump frequency with an electrical signal. By way of definition, traveling wave parametric amplifiers may be classified into essentially two categories: (a) the forward or simply traveling wave type parametric amplifier, wherein the signal phase velocity $v_{\phi s}$ and the signal group velocity, $v_{gs}$ are along the forward direction with respect to the pump wave, or are both of positive value, and (b) the backward traveling wave type parametric amplifier wherein $v_{\phi s}$ and $v_{gs}$ are along the backward direction with respect to the pump wave, or are both of negative value. In addition, there are what may be considered backward wave parametric amplifiers, wherein $v_{\phi s}$ and $v_{gs}$ are of opposite sign.

Traveling wave parametric amplifiers are conventionally constructed of a transmission medium comprising, for example, a wave guide, strip line, coaxial cable, or combination thereof, which are periodically loaded with nonlinear reactance active elements, such as capacitors, reactance diodes, inductors or ferrite slabs. Whereas in a cavity type parametric amplifier interaction of the mixed frequencies occurs at the same one or two active elements disposed in a standing wave pattern during many cycles of operation, in the traveling wave type amplifier the interaction occurs at a large number of active elements, and usually each element is perturbed only once by each wave of the traveling waves as they are propagated through the transmission medium. Since traveling wave transmission media are able to support continuous bands of frequencies, electronic tuning of the amplifier over a wide band of frequencies can be accomplished. A further description of tunable parametric amplifiers may be found in an article by P. K. Tien entitled "Parametric Amplification and Frequency Mixing in Propagating Circuits," appearing in the Journal of Applied Physics, vol. 29, No. 9, September 1958, and a low frequency embodiment is described in an article by D. I. Brietzer and E. W. Sard entitled "Low Frequency Prototype Backward Wave Reactance Amplifier," appearing in the Microwave Journal, vol. 2, No. 8, August 1959.

In the prior art, as for example described in the aforementioned publications, it has been possible to tune the amplifier by maintaining the ratio of $\omega_i/\omega_s$ constant. Although the constraint $\omega_i/\omega_s=K$ permits selective tuning, for high frequency signals, in the order of hundreds of megacycles, the pump frequency, which is required to be considerably higher than the signal for good amplification, must be tuned over an exceedingly wide range for signal frequency variations. For example, if the signal frequency is varied from 250–500 megacycles, the pump frequency is required to vary by the same ratio from, let use say, 2000–4000 megacycles. Since there is an inherent limitation in the range of adjustment of such high frequency pump sources, the band through which the signal frequency can vary, and hence the amplifier tuning range, is accordingly limited.

It is an object of the present invention to provide an improved electronically tunable traveling wave type parametric amplifier having a narrow bandwidth and which may be selectively tuned over an enhanced tuning range solely by adjustment of the pump frequency.

A further object of the present invention is to provide an improved electronically tunable traveling wave type parametric amplifier of the above type and having an improved noise characteristic.

These and other objects of the invention are accomplished in one embodiment thereof in the form of a backward traveling wave parametric amplifier. The amplifier includes a wave guide structure in which is propagated a pump wave. The wave guide structure encloses a conductor which is positioned in the center of the guide and runs along the longitudinal dimension thereof. The signal and idler waves are propagated along the center conductor. The direction of the propagation of the signal wave is opposite to that of the pump wave. The amplifier is successively loaded by nonlinear reactance diodes which are coupled between the center conductor and the wide dimension walls of the wave guide at spaced intervals along the longitudinal dimension of the guide. The idler wave is produced by the interaction of the pump and signal waves across the reactance diodes. In order for parametric amplification to occur, the three waves must be related so that the following constraints are satisfied: (1) the pump frequency is equal to the signal frequency plus the idler frequency; and (2) the pump phase constant is equal to the signal phase constant plus the idler phase constant. The wave guide and center conductor are constructed in a manner such that the waves propagated thereby exhibit frequency versus phase constant functions which permit the signal to be tuned over a range in which the idler wave is operated on the dispersive portion of the frequency versus phase constant function of the idler wave. In this range the idler frequency is maintained approximately constant and the idler phase constant is varying. In this manner, as the signal frequency changes, the amplifier can be tuned by changing the pump frequency by an amount approximately equal to the change in signal frequency, with the phase constants of the three waves changing so that the above mentioned constraints are always satisfied. Since the pump frequency need be changed only by an amount equal to the change in signal frequency, the amplifier may be selectively tuned over a wide range of signal frequency variations.

In accordance with a further aspect of the invention there is provided a forward traveling wave parametric amplifier embodiment in which the signal and pump waves are propagated in the same direction. As in the backward traveling wave amplifier embodiment, tuning is accomplished over a range in which the idler frequency is maintained approximately constant and the idler phase constant is varying.

In accordance with still another aspect of the invention, there is provided a traveling wave parametric amplifier embodiment in which the idler frequency is fixed irrespective of the phase constant. This amplifier may be operated either as a backward or forward traveling wave device. The amplifier includes a wave guide structure, in which is propagated the pump wave, and an enclosed conductor along which is propagated the signal wave. As in the previous embodiments, the amplifier is periodically loaded by reactance diodes. In addition, a plurality of resonating conductors are provided in the wave guide tuned to a fixed frequency in which the idler frequency is maintained. The electric fields of these resonating structures are coupled to the electric fields of the wave guide and enclosed conductor. Since the idler frequency is maintained fixed for all values of phase constant, the amplifier may be selectively tuned over a wide range of signal frequencies, as before.

In accordance with yet another aspect of the invention, the constant idler frequency embodiment described above may be employed as a frequency converter in which the inputs comprise the pump and signal waves and the output comprises the idler wave of fixed frequency.

While the specification concludes with claims particularly pointing out and distinctly claiming the subject matter which is regarded as applicants' invention, it is believed that the invention will be better understood from the following description taken in connection with the accompanying drawings in which:

FIGURE 13 illustrates an equivalent circuit of the parametric amplifier of FIGURE 10.

FIGURE 13A illustrates a modified portion of the device of the circuit of FIGURE 13 when the device is operated as a frequency converter.

FIGURE 14 illustrates Brillouin diagrams for the waves in the device of FIGURES 10–12.

Figure 1:
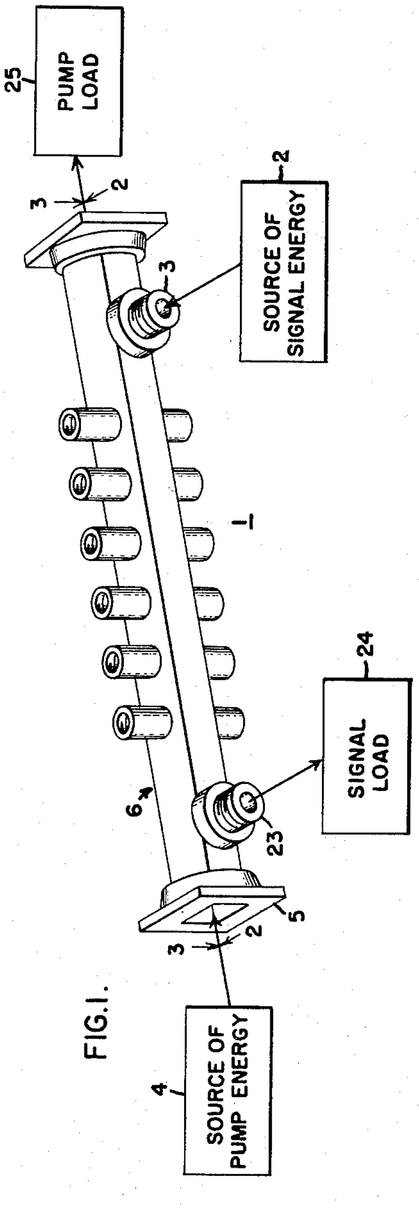
FIGURE 1 illustrates a perspective view of an embodiment of a backward traveling wave parametric amplifier operated in accordance with applicants' invention.

Referring now to FIGURE 1, there is shown in perspective view one embodiment of applicants' electronically tunable parametric amplifier device 1, which is operated as a backward traveling wave device, and having applied thereto a signal to be amplified and a pump wave which supplies power to the signal. A source of signal energy 2, for example, an antenna, applies the signal wave to connector 3 of device 1, and a source of pump energy 4, which may be a voltage tunable magnetron or a conventional backward wave tube, applies the pump wave to connector 5.

Figures 2, 3:
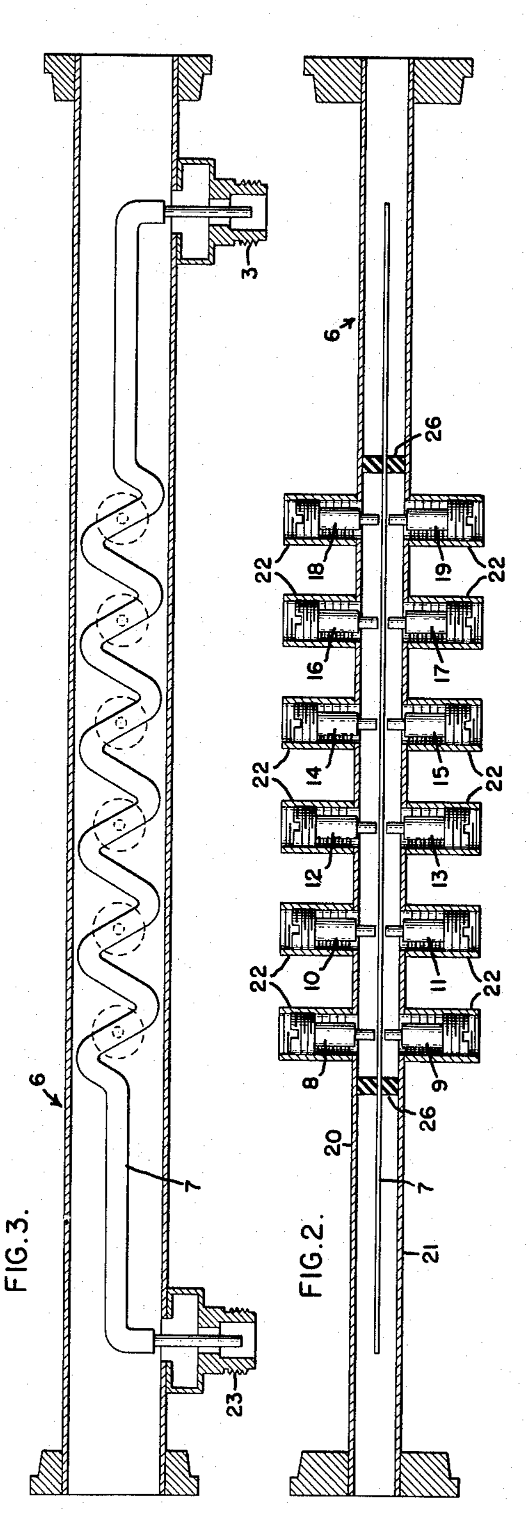
FIGURE 2 shows a cross-sectional view of the device of FIGURE 1 taken along the plane 2—2.
FIGURE 3 shows a cross-sectional view of the device of FIGURE 1 taken along the plane 3—3.

The amplifier device 1 includes a wave guide structure 6 and a single conductor 7 positioned in the center of the guide 6 and running along the longitudinal dimension thereof, as shown in the cross sectional view of FIGURES 2 and 3. The conductor 7 is physically supported by dielectric spacers 26. The wave guide structure 6 supports propagation of the pump wave and the center conductor 7 supports propagation of both signal and idler waves. The path length of the center conductor 7 determines the velocity in the longitudinal direction of the wave guide of the signal and idler waves. The center conductor 7 is provided with periodic undulations, illustrated in sinusoidal form, for increasing the path length and decreasing the velocity of the signal and idler waves in the longitudinal direction. Thus, the phase velocity of the three waves can be predetermined. This structural form of center conductor for determining the velocity of the propagated wave is superior to dielectric loading for this purpose, since it facilitates obtaining the velocity required and is not lossy like the dielectric. In addition the undulation can be varied to improve matching of the reactance load. Since the phase velocity is determined by the transmission medium, in this embodiment the phase velocity of the signal and idler waves as a function of frequency is equal in magnitude and opposite in direction. The phase velocity of the pump wave is made greater than the velocity of the idler and signal waves. The relationship of the velocities of the three waves is important in the tuning of the amplifier and will be subsequently considered in detail when considering the Brillouin diagrams of FIGURE 6 and the tuning requirements.

The amplifier device 1 is periodically loaded by a plurality of pairs of reactance diodes 8–9, 10–11, 12–13, 14–15, 16–17 and 18–19, shown in FIGURE 2, which are electrically coupled between the wide dimension walls 20 and 21 of the wave guide 6 and the center conductor 7. The diodes are shown adjustably mounted by a plurality of threaded sleeves 22 which are welded to the exterior surface of the walls 20 and 21. The diodes, which are of matched impedance characteristics for maximum signal amplification, are uniformly spaced and coupled to center points of conductor 7. In accordance with well known principles, the diodes are normally self-biased for operation in the backward direction. The three waves upon traveling through the device 1 interact across the diodes in the prescribed manner so that power is converted to the signal wave from the pump wave. The amplified signal appears at output connector 23 and is applied to load 24. The pump wave is terminated in a terminating load 25, and the idler wave is terminated in a terminating load in signal source 2.

Figures 4, 5A, 5B, 6:
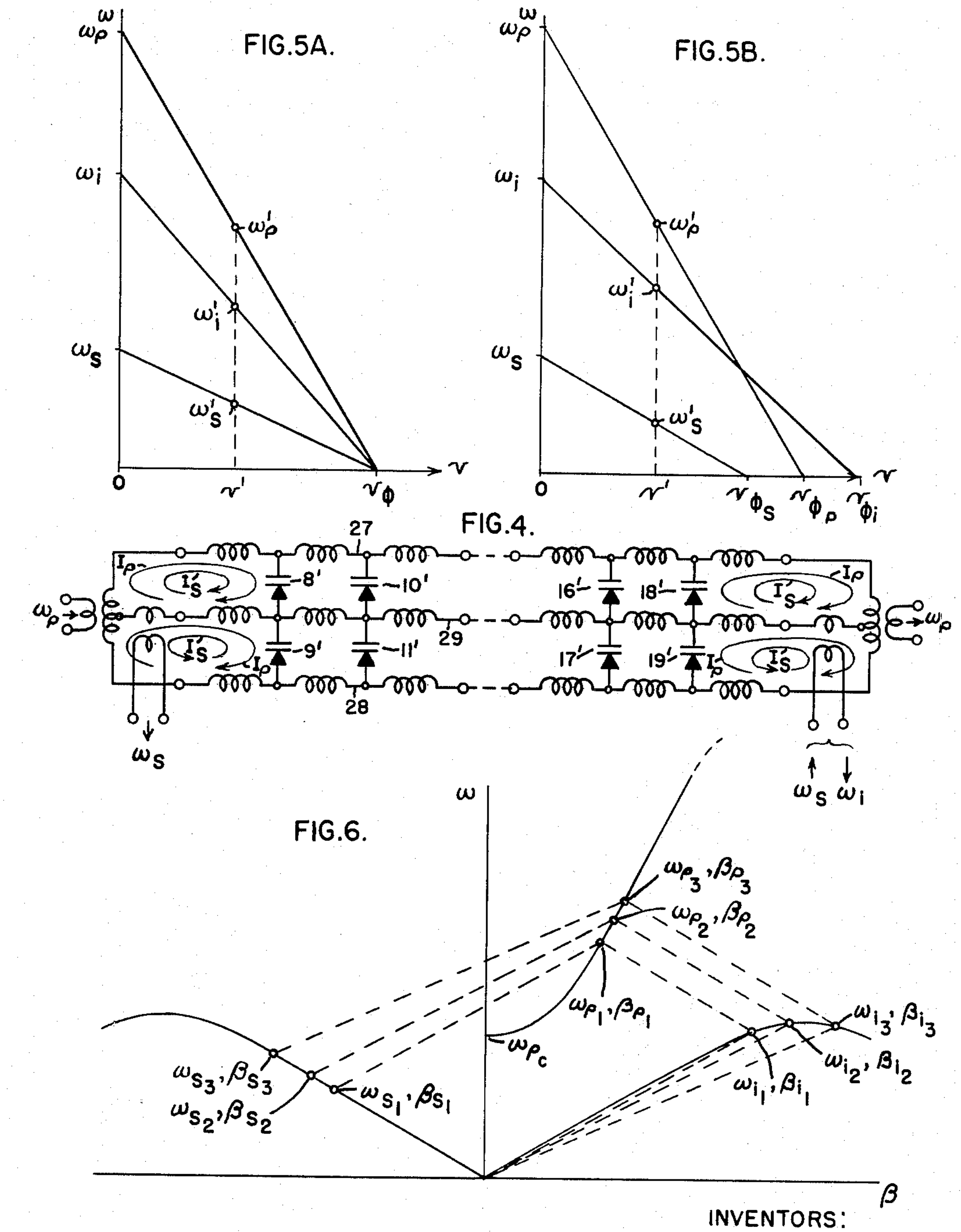
FIGURE 4 illustrates an equivalent circuit of the parametric amplifier of FIGURES 1–3.
FIGURE 5A illustrates a graph showing the Doppler effect of traveling waves wherein the waves have the same phase velocity and in which frequency, $\omega$, as plotted versus apparent phase velocity, $v$, of an observer.
FIGURE 5B illustrates a Doppler graph as in FIGURE 5A but wherein the waves have unequal phase velocities.
FIGURE 6 illustrates Brillouin diagrams for the three traveling waves in the backward traveling wave parametric amplifier of FIGURES 1 to 3 in which frequency $\omega$ is plotted versus phase constant, $\beta$.

In FIGURE 4 is illustrated an equivalent circuit of the parametric amplifier device of FIGURES 1 to 3 in which a pair of parallel inductive transmission lines 27 and 28 represent the wave guide structure and a third parallel inductive transmission line 29 represents the center conductor. Reactance diodes 8′, 9′, 10′, 11′, 16′, 17′, 18′ and 19′ corresponding to the diodes shown in FIGURE 2, into which is lumped the distributed capacitance between the lines 27, 28 and 29, are shown coupled between outer transmission lines 27 and 28 and the center transmission line 29. The pump wave is inductively coupled to the input of transmission lines 27 and 28, and the signal wave is inductively coupled to the input of the center transmission line 29. Inductive coupling is provided at the output of transmission lines 27 and 28 and at the output of line 29 for the exiting pump and signal waves, respectively. The idler wave output is shown coupled to the signal wave input.

The equivalent circuit is balanced since the signal and pump energy is uncoupled at the input and output terminals. Application of the pump wave produces current in the closed paths which may be shown as $I_p$. It is noted that the $I_p$'s are bucking and cancel out across the inductance coupled to the signal input and output terminals. Similarly, application of the signal wave produces current in the closed paths which may be shown as $I_s$ having a canceling effect across the inductance coupled to the pump input and output terminals. These currents flow through the diodes as they proceed down their respective paths with energy being transferred to the signal wave from the pump wave.

Before proceeding further with the description of the backward traveling wave parametric amplifier embodiment of FIGURES 1–3, we shall derive the constraints required to be imposed in the tuning of a traveling wave parametric amplifier. The interaction of the traveling waves in a traveling wave parametric amplifier can be constructed from the interactions in a cavity type parametric amplifier in which exist standing waves. In the cavity amplifier, it is known that a condition for obtaining amplification is that the pump frequency must be equal to the sum of the signal and idler frequencies. Expressed as an equation, $$\omega_p = \omega_s + \omega_i \qquad (1)$$

The active element of the cavity type parametric amplifier, a variable reactance diode for example, sees the standing waves of these three frequencies. Now let us move the cavity at a fixed velocity $v_\phi$ so that to an outside stationary observer the standing waves become traveling waves each moving at velocity $v_\phi$. The velocity $v_\phi$ may be expressed as $$v_\phi = \frac{\omega}{\beta}$$

where $\beta$ is the phase constant of the new traveling waves, equal to $$2\frac{\pi}{\lambda}$$

Since the velocity of the three waves is said to be equal we can write the relationship, $$\omega_p/\beta_p = \omega_s/\beta_s = \omega_i/\beta_i = v_\phi \qquad (2)$$

and $$\beta_p = \beta_s + \beta_i \qquad (3)$$

where the subscripts $p$, $s$, and $i$ denote pump, signal and idler properties.

For parametric amplification of traveling waves the limitation imposed by Equation 2 is removed in subsequent discusion, and it will be seen that the only constraints to be met are those recited in Equations 1 and 3.

It is obvious that the cavity amplifier will operate irrespective of whether the cavity is stationary or moving. It will now be shown by referring to FIGURE 5A that likewise three traveling waves having the same velocity will perform parametric amplification. In FIGURE 5A is plotted the apparent frequencies of the three waves in the moving cavity as seen by an observer moving in the direction of the cavity, or the apparent frequencies versus the observer velocity. Thus, $\omega_p'$, $\omega_s'$, $\omega_i'$ are the apparent frequencies as seen by an observer who is moving at a velocity $v'$. These apparent frequencies are in fact the Doppler frequencies, and based upon the Doppler relations, or the simple geometry of FIGURE 5A, we conclude that since $\omega_p = \omega_s + \omega_i$, then $\omega_p'$ is equal to $\omega_s' + \omega_i'$. Thus, Equation 1 is automatically satisfied and the interaction and parametric amplification of the traveling waves is assured.

Now, let us consider Equations 2 and 3 and show that the limitation of Equation 2 is not necessary. Considering the geometry of FIGURE 5A we may write the following equations:

$$\begin{aligned} \omega_p' &= \omega_p - \beta_p v' \\ \omega_s' &= \omega_s - \beta_s v' \\ \omega_i' &= \omega_i - \beta_i v' \end{aligned} \qquad (4)$$

If the velocities of the signal and idler waves are changed so that the velocities of the three waves are different, as shown in FIGURE 5B, the Equations 4 are modified as follows:

$$\begin{aligned} \omega_p' &= \omega_p - \beta_p v' \\ \omega_s' &= \omega_s - (\beta_s + \Delta\beta) v' \\ \omega_i &= \omega_i - (\beta_i - \Delta\beta) v' \end{aligned} \qquad (5)$$

we see that it is unnecessary for the velocities to be equal so long as the phase constants are related by $\beta_p = \beta_s + \beta_i$. Thus, it is established that traveling waves will interact to provide parametric amplification if the relations of Equations 1 and 3 are satisfied.

In considering the tuning operation of the parametric amplifier of FIGURES 1 to 3 it is desirable to examine the Brillouin diagrams of FIGURE 6 in which the frequencies of the three traveling waves $\omega$ are plotted versus the phase constants $\beta$. The value of $\omega/\beta$ for the curves shown will be appreciated to be the phase velocity $v_\phi$ of the various waves. Further it can be mathematically proven that the velocity of the energy of propagation in the longitudinal direction, or the group velocity $v_g$, is equal to the slope of the $\omega$—$\beta$ curves. Brillouin, or $\omega$ versus $\beta$, diagrams can be readily constructed for any given transmission medium by well known techniques, as disclosed, e.g., in D. A. Watkins' Topics in Electromagnetic Theory.

The $\omega$—$\beta$ curve for the pump wave is partially parabolic in form, crossing the $\omega$ axis at the wave guide cutoff frequency $\omega_{pc}$. At the higher frequencies the curve exhibits dispersion and varies sinusoidally, not shown. By dispersion it is meant that the slope of the curve is not equal to a constant, and coincidentally dispersion causes the slope to pass through a zero value where the frequency is constant for a changing phase constant. The pump phase velocity $v_{\phi p}$ is seen to be positive. Examining the signal wave, it is seen that the $\omega$—$\beta$ curve is linear at the lower frequencies, dispersing and becoming nonlinear in the upper frequency region. The phase velocity $v_{\phi s}$ of the signal wave is negative and of lower magnitude than that of the pump wave. In accordance with the present embodiment, the phase velocity $v_{\phi i}$ of the idler wave, as a function of frequency, is equal in magnitude but opposite in direction to $v_{\phi s}$, so that the $\omega$—$\beta$ curves for the two waves are the mirror image of each other. However, these velocities may be unequal as long as the relationships defined in Equations 1 and 3 exit. It may be appreciated that individual transmission paths are necessary for the signal and idler waves when their velocities are unequal.

The dispersive portion of the $\omega$—$\beta$ curves for the three waves in the upper frequency region is a characteristic of the periodic capacitive diode loading in the amplifier. It may be appreciated that in the absence of any loading the signal and idler curves would be entirely linear, and the pump curve would be linear except for the lower dispersive portion which is due to the wave guide and load characteristics. In accordance with applicants' invention, the dispersive portion of the idler $\omega$—$\beta$ curve is employed when selectively tuning the amplifier over a wide range. Thus, tuning is performed over a range in which $\omega_i$ is approximately constant while $\beta_i$ is changing. In this manner as the signal frequency changes, the amplifier can be tuned by changing the pump frequency by approximately the same amount.

As an example of the tuning operation and referring to the Brillouin diagrams of FIGURE 6, we will assume an initial signal frequency of $\omega_{s1}$ coupled to the input terminals of the amplifier. By tuning pump source 4, the pump frequency is adjusted to $\omega_{p1}$ so as to provide an idler frequency $\omega_{i1}$ on the dispersive portion of the idler $\omega-\beta$ curve at $\omega_{i1}$ so that $\omega_{p1}=\omega_{s1}+\omega_{i1}$. The pump source 4 is preferably of the type which is tuned by an electrical signal and which is continuously tuned over a predetermined range until it assumes a frequency where parametric amplification occurs. In accordance with well known techniques a feedback signal is supplied to the source which causes the frequency to lock on to this value. In this manner electronic tuning of the amplifier can be rapidly accomplished, e.g., within .1 millisecond. By providing the proper relationship between the phase velocities of the three waves, as noted in the foregoing explanation relating to FIGURES 5A and 5B, at the operating frequencies the waves will also be related by $\beta_{p1}=\beta_{s1}+\beta_{i1}$. Thus, parametric amplification occurs. Now, as $\omega_s$ changes, e.g., to $\omega_{s2}$, $\omega_p$ is changed by approximately the same amount to $\omega_{p2}$ and the idler frequency changes to $\omega_{i2}$, which is approximately equal to $\omega_{i1}$. At these points $\beta_{p2}=\beta_{s2}+\beta_{i2}$. As the signal changes to $\omega_{s3}$, $\beta_{s3}$, the pump is tuned to $\omega_{p3}$, $\beta_{p3}$ and the idler wave assumes a value of $\omega_{i3}$, $\beta_{i3}$ where $\omega_{i3}$ is approximately equal to $\omega_{i2}$ and $\beta_{i3}$ is changed from $\beta_{i2}$ so that the $\omega$ and $\beta$ constraints are again satisfied. It is noted that for each tuned condition of the amplifier wherein the $\omega$, $\beta$ constraints of Equations 1 and 3 are satisfied, the operating points of the $\omega-\beta$ curves describe a parallelogram joined to the origin.

In one exemplary operative embodiment of the invention, the signal wave varied from 3,180 to 5,180 mc. and the pump was tuned from 8,520 to 10,680 mc.

As a further feature of applicants' tuning device, it may be appreciated that the tuning operation will not produce undesirable upper side bands resulting from the mixing of the signal and pump waves. These side bands are undesirable because they absorb power from the signal wave. Upon examining FIGURE 6 it is seen that the upper side bands, having a frequency $\omega_p+\omega_s$ and a phase constant of $\beta_p+\beta_s$, cannot be propagated since they do not fall on any of the $\omega-\beta$ curves.

An added advantage of providing a constant idler frequency is that excessive noise found to be contributed by the idler can be reduced. The idler noise figure may be expressed as $$NF\cong 1+\frac{\omega_s}{\omega_i}\cdot\frac{T_i}{T_0}$$

wherein $T_i$ is the temperature of the idler termination and $T_0$ is the reference temperature of the amplifier. In order to achieve the best idler noise reduction, it is necessary to maintain the approximately constant idler frequency at the higest possible value.

Although the backward traveling wave parametric amplifier of FIGURES 1 to 3 has been described with relation to a specific structure having transmission paths providing specific phase and group velocities for the three traveling waves, as illustrated in FIGURE 6, it may be recognized that many other circuit constructions can be employed to which applicants' basic principles are applicable. The velocity relationships illustrated provide tuning over a given range. However, these relationships may be varied as desired by modifying the construction and/or the delay of the transmission paths to provide tuning over other frequency ranges. For example, for a steeper idler $\omega-\beta$ curve, i.e., an increased $v_{\phi i}$ characteristic, the amplifier can be tuned over a lower range of signal frequencies. This may be accomplished by reducing the delay of the idler transmission path. Further, although operation has been illustrated with relation to the linear portion of the signal and pump $\omega-\beta$ curves, tuning in accordance with applicants' invention can be accomplished on the dispersive portion of these curves if desired.

It is also noted that the pump wave may be readily propagated along a form of coaxial conductor exhibiting an $\omega-\beta$ curve originating at the origin.

In determining the relationships of the phase and group velocities in other modifications it is necessary that the $\omega$, $\beta$ constraints always be satisfied. In addition, there must be operation on the dispersive portion of the idler wave, preferably near the edge of the pass band. In this manner there will be provided in accordance with applicants' invention, selective tuning of the amplifier over a wide range. It should also be borne in mind that it is desirable, from a noise figure standpoint, to provide an idler frequency which exceeds the signal frequency by as great an amount as possible. It is also required that the frequency of the pump wave be greater than the idler frequency for the proper flow of power from the pump to the signal.

Figure 7:
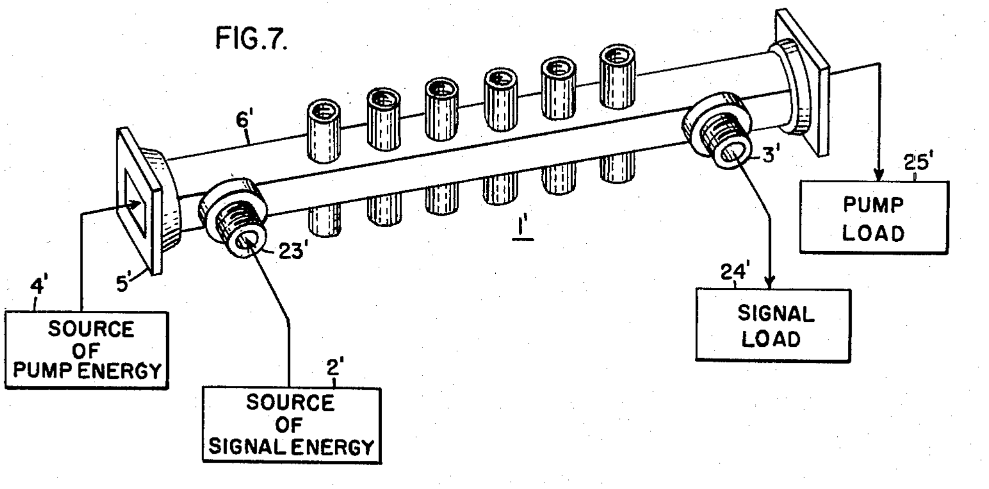
FIGURE 7 illustrates a perspective view of an embodiment of a forward traveling wave parametric amplifier operated in accordance with applicants' invention.

Referring now to FIGURE 7, there is illustrated a perspective view of a forward traveling wave parametric amplifier embodiment which is similar in construction to the amplifier device of FIGURES 1 to 3. The forward traveling wave amplifier normally has greater stability but less gain than the backward type. The components illustrated in FIGURE 7 are therefore identified by the same numerals as found in FIGURE 1, with an added prime notation. The amplifier differs from that of FIGURE 1 in that the pump and signal waves are coupled so as to travel in the same direction in the amplifier device 1'. Thus, the source of signal energy 2' is coupled to connector 23' with the pump source 4' coupled to connector 5'. The amplified signal appears at the output connector 3' and is coupled to the load 24'. In this embodiment the center conductor, not visible in FIGURE 7, supports propagation of the signal wave, and the wave guide structure 6' supports propagation of both the pump and idler waves which waves are terminated in the load 25'. Thus, the pump and idler waves have the same $\omega-\beta$ curves. The phase velocities of these waves is made greater than the phase velocity of the signal wave. The relationship of these velocities is illustrated in the Brillouin diagrams of FIGURE 9.

Figure 8:
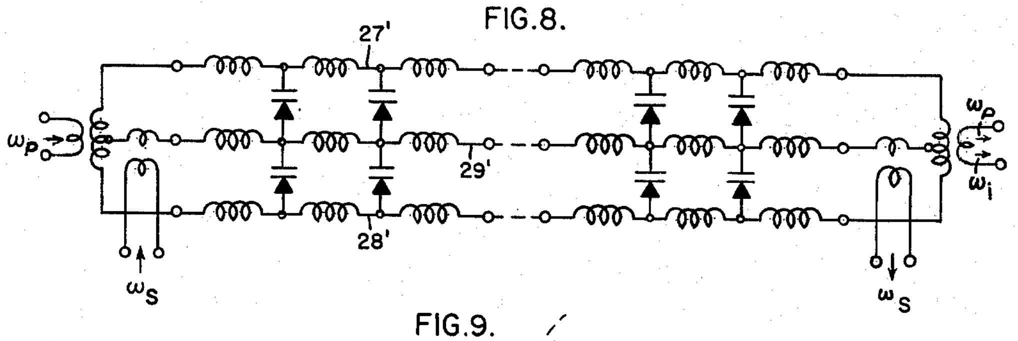
FIGURE 8 illustrates an equivalent circuit of the parametric amplifier shown in FIGURE 7.

The equivalent circuit of the forward traveling wave parametric amplifier is shown in FIGURE 8, and is seen to be essentially identical to the equivalent circuit of FIGURE 4 includes transmission lines 27', 28' and 29' and the reactance diodes coupled between them. However, the signal and pump waves are applied to the input terminals so as to provide propagation in the same direction.

It is noted that the structure of FIGURE 7 is a specific form of a forward traveling wave parametric amplifier which has the advantage of requiring merely two transmission paths. The more general form would be one in which a separate transmission path is provided for the idler wave and might consist of a second center conductor included in the wave guide structure. In such construction the reactance diodes can be coupled from each of the center conductors to the wide dimension walls of the wave guide, with the electric fields of the three waves coupled together to react across said diodes.

Figure 9:
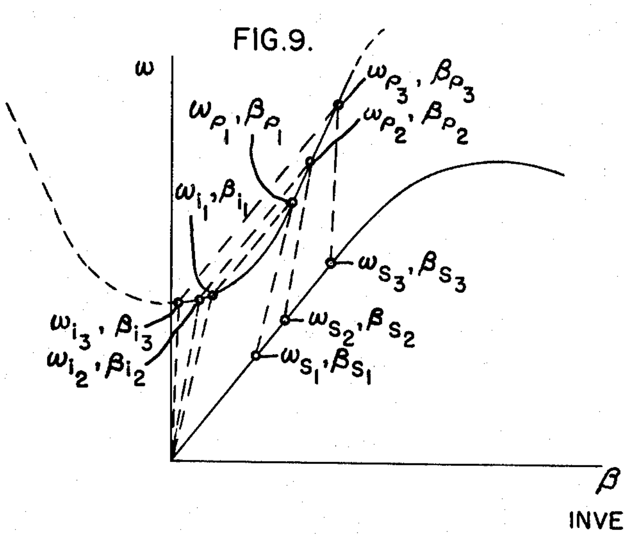
FIGURE 9 illustrates Brillouin diagrams for the traveling waves in the forward traveling wave parametric amplifier illustrated in FIGURE 7.

The operation of the forward traveling wave device is similar to that of the backward traveling wave device, and will be explained with reference to the Brillouin diagrams of FIGURE 9. As previously, the same $\omega$, $\beta$ constraints must be met and operation performed on the approximately constant frequency nonlinear portion of the idler $\omega-\beta$. Thus, for a signal frequency of $\omega_{s1}$ the pump source 4 is tuned to provide a pump frequency of $\omega_{p1}$ which mixes with the signal frequency to provide an idler frequency $\omega_{i1}$ on the nonlinear rounded portion of the $\omega-\beta$ curve of the idler wave, which in this instance is the same as the $\omega-\beta$ curve of the pump wave. The phase constants at these operating points are given by $\beta_{p1}$, $\beta_{s1}$ and $\beta_{i1}$, where, as previously $\omega_{p1}=\omega_{s1}+\omega_{i1}$ and $\beta_{p1}=\beta_{s1}+\beta_{i1}$. As $\omega_s$ changes to $\omega_{s2}$, $\omega_p$ is changed by approximately the same amount of $\omega_{p2}$ and the idler frequency changes to $\omega_{i2}$, which is approximately equal to $\omega_{i1}$. Accordingly, as $\omega_s$ is changed to some other frequency, $\omega_p$ is tuned accordingly so that the $\omega-\beta$ constraints are always satisfied. It is noted that under some tuning conditions the idler $\omega-\beta$ curve will extend into the minus $\beta$ region, as shown by the dotted line. As with the backward traveling wave amplifier embodiment, the signal may be selectively tuned over a wide range by maintaining the idler frequency $\omega_i$ approximately constant and varying the idler phase constant $\beta_i$. In addition as previously, no upper sideband component resulting from the mixing of the signal and pump waves is propagated.

Figure 10:
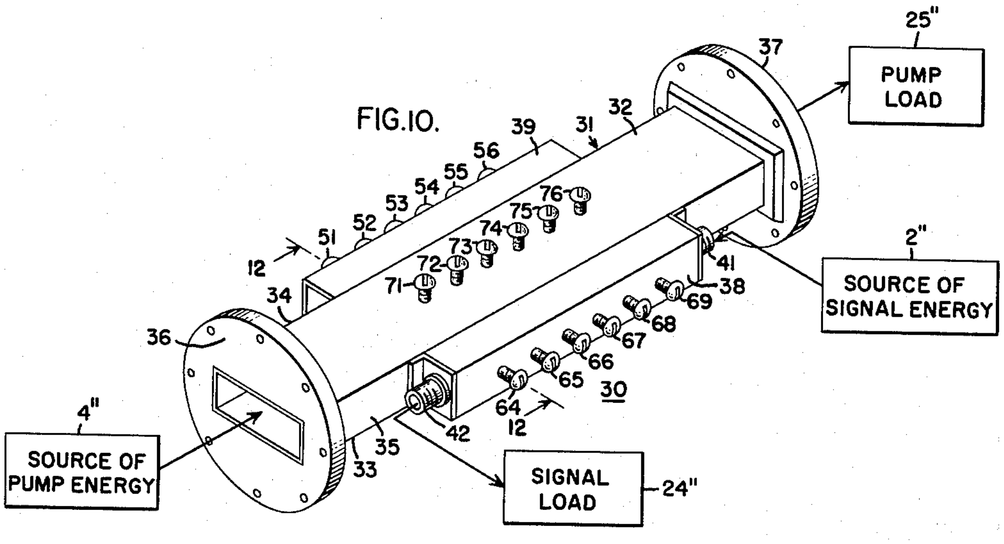
FIGURE 10 illustrates a perspective view of another embodiment of a backward traveling wave parametric amplifier in accordance with applicants' invention in which are provided resonant circuits for maintaining the idler frequency constant.

Referring now to FIGURE 10, there is illustrated in perspective view another embodiment of applicants' invention, a traveling wave parametric amplifier device 30 in which the idler frequency is maintained constant irrespective of the idler phase constant.

Figure 11:
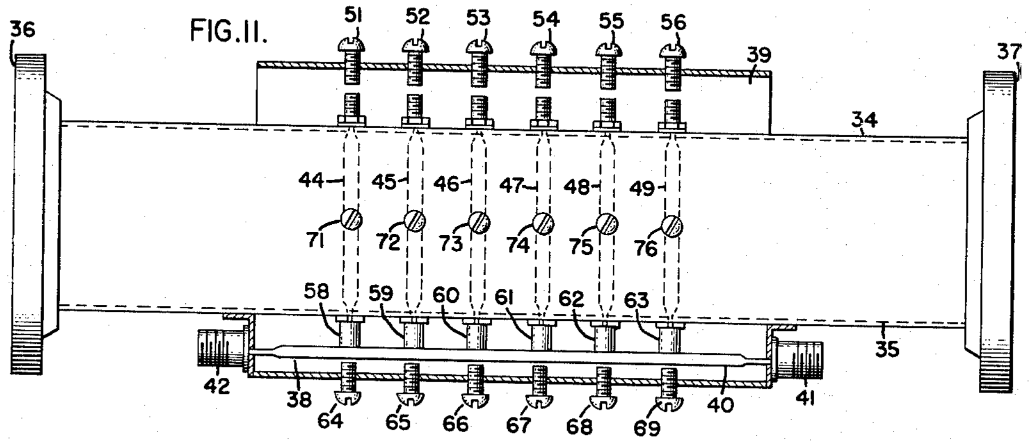
FIGURE 11 illustrates a partially broken away top view of the device of FIGURE 10.
Figure 12:
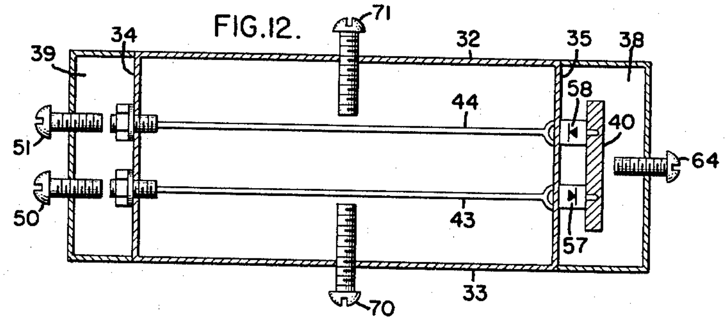
FIGURE 12 illustrates a cross-sectional view of the device of FIGURE 10 taken along the plane 12—12.

The amplifier device 30 includes a wave guide structure 31 composed of wide dimension walls 32 and 33 and narrow dimension walls 34 and 35, and having an input connector 36 and an output connector 37. A pump source 4'', which may be identical to that shown in FIGURE 1, is connected to input connector 36 for propagating the pump wave through the wave guide. The pump wave is terminated in load 25'' which is coupled to the output connector 37. Two enclosed compartments 38 and 39 are attached to the narrow dimension walls 34 and 35. Compartment 38 encloses a center conductor 40 which runs axially through the compartment, as shown in FIGURE 11. The center conductor 40 is preferably provided with periodic undulations, similar to the center conductor shown in FIGURE 3. Compartment 38 has an input connector 41 and an output connector 42. A signal source 2'', which may be identical to the signal source of FIGURE 1, is connected to input connector 41 for propagation of the signal wave by said center conductor. The amplified signal is coupled from output connector 42 to signal load 24''. Twelve transverse conductors, arranged in pairs, of which 43, 44, 45, 46, 47, 48 and 49 are shown in FIGURES 11 and 12, are enclosed in the wave guide structure 31, running transversely across said wave guide structure parallel to the wide dimension walls 32 and 33 and secured to the narrow dimension walls 34 and 35. Compartment 39 contains twelve tuning stubs, one for each transverse conductor, of which stubs 50, 51, 52, 53, 54, 55 and 56 are shown coupled to the transverse conductors 43 to 49 respectively. The tuning stubs tune the transverse conductors to a fixed frequency. Thus, the transverse conductors and tuning stubs act as resonant circuits in which is resonated the fixed idler frequency. Twelve matched reactance diodes, arranged in pairs, of which 57, 58, 59, 60, 61, 62 and 63 are shown in FIGURES 11 and 12, are coupled between the center conductor 40 and the transverse conductors. Diodes 57 to 63 are shown coupled between conductor 40 and transverse conductors 43 to 49 respectively. The diodes of each pair are poled in opposite directions. Each pair of diodes has coupled thereto a tuning stub for matching the capacitive characteristics of the diodes, shown as 64, 65, 66, 67, 68 and 69. Twelve additional tuning stubs, of which 70, 71, 72, 73, 74, 75 and 76 are shown, are inserted through the wide dimension walls 32 and 33 into the hollow portion of the wave guide 31 and adjacent to the transverse conductors. These latter stubs disturb the fields within the guide so as to couple the pump energy to the transverse conductors. Thus, the pump, signal and idler waves are coupled across the reactance diodes and interact to provide parametric amplification.

In FIGURE 13, there is illustrated an equivalent circuit of the parametric amplifier of FIGURES 10–12. This equivalent circuit assumes a form similar to the equivalent circuits of FIGURES 4 and 8, including a pair of parallel inductive transmission lines 80 and 81 representing the wave guide structure, and a third parallel inductive transmission line 82, representing the center conductor. Reactance diodes 83, 84, 85, 86, 87, 88, 89 and 90, corresponding to the diodes of FIGURES 10–12 and into which is lumped the distributed capacitance between the inductive transmission lines, are shown coupled between the outer transmission lines 80 and 81 and the center transmission line 82. In addition, a plurality of L-C resonant circuits 91, 92, 93, 94, 95, 96, 97 and 98, corresponding to the transverse conductors and associated tuning stubs of FIGURE 10–12, are inductively coupled to the reactance diodes 83 to 90 respectively. The pump signal is inductively coupled to the input of transmission lines 80 and 81 and the signal wave is inductively coupled to the input of the center transmission line 82. Inductive coupling is shown at the output of transmission lines 80 and 81 and at the output of transmission line 82 for the exiting pump and signal waves, respectively.

The operation of the traveling parametric amplifier device of FIGURES 10–13 is similar to the operation of the previously described device, and will be explained with reference to the Brillouin diagrams of FIGURE 14. It is seen that the $\omega-\beta$ curves for the pump and signal waves are similar to those shown in FIGURE 6, although the signal $\omega-\beta$ curve is less steep so that the edge of the pass band of the signal wave is below the cut-off frequency of the pump wave. The idler frequency is a constant value, preferably positioned between said edge and the cut-off frequency so that the signal, pump and idler waves exist in mutually exclusive frequency regions. Since a second idler $\omega-\beta$ curve which is the mirror image of the signal $\omega-\beta$ curve also exists, but not shown, positioning the fixed idler frequency as described avoids the possibility of tuning to more than one signal frequency band for a single pump frequency setting. The idler $\omega-\beta$ curve is shown as a horizontal line indicating that the idler frequency is constant for all values of $\beta$. Actually the idler is a standing wave, in this embodiment, for which the phase constant property is normally not applicable. However, mixing of the pump and signal waves across each of the diodes provides an idler waves of the proper phase, so that the idler wave may be considered to have a phase constant which varies as the varying signal is tuned.

Examining FIGURE 14 and assuming a signal having the properties $\omega_{s1}$, $\beta_{s1}$, the pump wave is tuned to $\omega_{p1}$, $\beta_{p1}$ and the idler assumes the properties $\omega_{i1}$, $\beta_{i1}$. For these operating points, as denoted by the dotted parallelograms, the $\omega$, $\beta$ constraints are satisfied. As the signal changes to $\omega_{s2}$, $\beta_{s2}$, the pump is tuned to $\omega_{p2}$, $\beta_{p2}$ and the idler changes to $\omega_{i1}$, $\beta_{i2}$. As the signal changes to any other value within the tuning range, e.g., $\omega_{s3}$, $\beta_{s3}$, the pump is tuned accordingly, the idler frequency being maintained constant by the resonant circuits but its apparent phase constant varying so as to satisfy the $\omega$, $\beta$ constraints.

As an advantage of the constant idler embodiment of FIGURES 10 to 12, the signal, pump and idler frequencies can be readily isolated so as to avoid a double tuned condition. In addition the gain of the amplifier is enhanced by the resonant idler operation. Further, the range of $\beta$ values over which the idler wave is operated is unlimited, providing a more flexible tuning of the signal wave.

The device of FIGURES 10–12 can also be employed as a frequency converter by employing the idler wave as the output signal. This can be readily accomplished by coupling a coaxial conductor to one or more of the transverse conductors, such as to the conductor at the end of device 30 from which the pump wave is taken, wherever the idler wave amplification is the greatest. For example the coaxial conductor can be connected to replace the tuning stub 56. This modification is shown in the modified equivalent circuit illustrated in FIGURE 13A.

Although the invention has been described with reference to a number of specific embodiments, the basic principles disclosed are not to be limited thereto. Thus, although wave guides and strip line conductors have been employed in the illustrated embodiments, the invention has equal application to all forms of transmission lines through which traveling waves can occur as represented in the equivalent circuits of FIGURES 4, 8 and 13. Thus, wave guides, strip lines, coaxial cable and lower frequency filter networks can be utilized in any combination desired in which the three waves interact across nonlinear elements.

Further, the reactance elements have been disclosed as periodically spaced. It may be appreciated that this is primarily for the purpose of minimizing reflections of the propagated energy and obtaining uniform amplification over the tuning range of the signal frequency. Operation of the parametric device in accordance with applicants' principles may nevertheless be accomplished with an uneven spacing of the reactance elements.

The phrase "dispersion in the $\omega$ versus $\beta$ function of said paths" has been used in certain of the claims to designate a nonlinearity or curvature of the $\omega$ versus $\beta$ function of the wave transmission paths. The term "dispersion" is used in a sense implying that the propagation constant is dependent upon frequency. The important property of these dispersive regions is that they designate regions of minimum slope in the $\omega$ versus $\beta$ function. Operation of the idler at such a region of minimum slope, in accordance with the invention, maximizes the signal tuning range obtainable from a pump having a given but restricted tuning range.

While in the foregoing embodiments, the parametric operation and loading of the wave transmission paths (for causing dispersion in the $\omega$ versus $\beta$ function) have primarily arisen in the same devices, such as the diodes, it should be understood that the functions are to a certain degree independent, since parametric amplification is dependent upon nonlinearity of the reactive loading means and "dispersion" is dependent merely on the magnitude of the loading means. Accordingly, it should be recognized that the above noted functions may be provided by separate means if so desired.

The invention may be also applicable to other forms of transmission media, in addition to those specifically disclosed herein, which relate to tunable traveling wave parametric amplification.

The appended claims are intended to include all modifications and variations that fall within the true scope and spirit of the invention.

What we claim as new and desire to secure by Letters Patent of the United States is:

1. A tunable traveling wave parametric amplifier comprising a multipath transmission line the paths of which support a signal wave of frequency $\omega_s$ and phase constant $\beta_s$ and phase constant $\beta_p$, a pump wave of frequency $\omega_p$ and an idler wave of frequency $\omega_i$ and phase constant $\beta_i$, said waves being related by $\omega_p=\omega_s+\omega_i$ and $\beta_p=\beta_s+\beta_i$, nonlinear reactance loading means across which said signal, pump and idler waves parametrically interact coupled to the paths of said transmission line, said nonlinear reactance loading means causing a dispersive region of substantially minimum slope in the $\omega$ versus $\beta$ functions of said paths, where $\omega$ is the frequency and $\beta$ is the phase constant of the waves supported thereby, said paths being constructed so as to provide for a given band of tuned signal frequencies operation of the idler wave at about said dispersive region of the idler path $\omega$ versus $\beta$ function.

2. A tunable traveling wave parametric amplifier comprising a multipath transmission line including a waveguide structure the walls of which enclose at least a single conductor running axially through said waveguide, a pump wave of frequency $\omega_p$ and phase constant $\beta_p$ being propagated through said waveguide and a signal wave of frequency $\omega_s$ and phase constant $\beta_s$ being propagated along said conductor, nonlinear reactance means for loading the paths of said transmission line, said nonlinear reactance means causing a near zero slope dispersive region in the $\omega$ versus $\beta$ functions of said paths, where $\omega$ is the frequency and $\beta$ is the phase constant of the waves propagated thereby, said signal and pump waves reacting across said nonlinear reactance means to provide an idler wave of frequency $\omega_i$ and phase constant $\beta_i$, said waves being related by $\omega_p=\omega_s+\omega_i$ and $\beta_p=\beta_s+\beta_i$, said idler wave being propagated by one of said transmission lines, said paths being constructed so as to provide, for a given band of tuned signal frequencies, operation of the idler wave at about said dispersive region of the idler path $\omega$ versus $\beta$ function, where the idler frequency is approximately constant and the idler phase constant is varying, whereby the signal frequency can be selectively tuned over a wide range of frequencies with a minimum tuning range required of the pump frequency.

3. A tunable traveling wave parametric amplifier as in claim 2 wherein said conductor has an undulating construction which provides a delay of the signal wave propagated thereby.

4. A tunable backward traveling wave parametric amplifier for amplifying a signal wave of frequency $\omega_s$ and phase constant $\beta_s$ by a mixing operation which converts power from a pump wave of frequency $\omega_p$ and phase constant $\beta_p$ comprising a multipath transmission line including a waveguide structure the walls of which enclose a conductor running axially through said waveguide, first means for coupling said pump wave to said waveguide to provide propagation of said pump wave through said waveguide in a first direction, said second means for coupling said signal wave to said conductor to provide propagation of said signal wave along said conductor in the opposite direction, nonlinear reactance elements coupled between said conductor and the walls of said waveguide and substantially uniformly spaced along the length of said conductor and waveguide walls for periodically loading the paths of said transmission line, said nonlinear reactance elements causing a near zero slope dispersive region in the $\omega$ versus $\beta$ functions of said paths, where $\omega$ is the frequency and $\beta$ is the phase constant of the waves propagated thereby, said signal and pump waves reacting across said nonlinear reactance elements to provide an idler wave of frequency $\omega_i$ and phase constant $\beta_i$, said waves being related by $\omega_p=\omega_s+\omega_i$ and $\beta_p=\beta_s+\beta_i$, said idler wave being propagated along said conductor in said first direction, said paths being constructed so as to provide, for a given band of tuned signal frequencies, operation of the idler wave at about said dispersive region of the idler path $\omega$ versus $\beta$ function where the idler frequency is approximately constant and the idler phase constant is varying, whereby the signal frequency can be selectively tuned over a wide range of frequencies with a minimum tuning range required of the pump frequency.

5. A tunable forward traveling wave parametric amplifier for amplifying a signal wave of frequency $\omega_s$ and phase constant $\beta_s$ by a mixing operation which converts power from a pump wave of frequency $\omega_p$ and phase constant $\beta_p$ comprising a multipath transmission line including a waveguide structure the walls of which enclose a conductor running axially through said waveguide, first means for coupling said pump wave to said waveguide to provide propagation of said pump wave through the waveguide in a given direction, second means for coupling said signal wave to said conductor to provide propagation of said signal wave along said conductor in said given direction, nonlinear reactance elements coupled between said conductor and the walls of said waveguide and substantially uniformly spaced along the length of said conductor and waveguide walls for periodically loading the paths of said transmission line, said nonlinear reactance elements causing a near zero slope dispersive region in the $\omega$ versus $\beta$ functions of said paths, where $\omega$ is the frequency and $\beta$ is the phase constant of the waves propagated thereby, said signal and pump waves reacting across said nonlinear reactance elements to provide an idler wave of frequency $\omega_i$ and phase constant $\beta_i$, said waves being related by $\omega_p=\omega_s+\omega_i$ and $\beta_p=\beta_s+\beta_i$, said idler wave being propagated through said wave guide, said paths being constructed so as to provide, for a given band of tuned signal frequencies, operation of the idler wave at about said dispersive region of the idler path $\omega$ versus $\beta$ function where the idler frequency is approximately contant and the idler phase constant is varying, whereby the signal frequency can be selectively tuned over a wide range of frequencies with a minimum tuning range required of the pump frequency.

6. A tunable traveling wave parametric amplifier comprising a multipath transmission line the paths of which support a signal wave of frequency $\omega_s$ and phase constant $\beta_s$, a pump wave of frequency $\omega_p$ and phase constant $\beta_p$ and an idler wave of frequency $\omega_i$ and phase constant $\beta_i$, said waves being related by $\omega_p=\omega_s+\omega_i$ and $\beta_p=\beta_s+\beta_i$, nonlinear reactance elements for periodically loading said transmission line, said reactance elements being coupled to and spaced along the length of said paths so that said signal, pump and idler waves are caused to parametrically interact thereacross, the periodic loading of said nonlinear reactance elements causing a near zero slope dispersive region in the $\omega$ versus $\beta$ functions of said paths, where $\omega$ is the frequency and $\beta$ is the phase constant of the waves supported thereby, said paths being constructed so as to provide for a given band of tuned signal frequencies dispersive operation of the idler wave at about said dispersive region of the idler path $\omega$ versus $\beta$ function where the idler frequency is approximately constant and the idler phase constant is varying.

7. A tunable traveling wave parametric amplifier for amplifying a signal wave of frequency $\omega_s$ and phase constant $\beta_s$ by a mixing operation which converts power from a pump wave of frequency $\omega_p$ and phase constant $\beta_p$ comprising a multipath transmission line, a first path of said transmission line supporting said signal wave, a second path of said transmission line supporting said pump wave, non-propagating resonant circuit means tuned to a constant frequency coupled along said first and second paths, nonlinear reactance means coupled to said first and second paths and to said resonant circuit means for loading said transmission line, said pump and signal waves reacting across said nonlinear reactance means to produce an idler wave of frequency $\omega_i$ and phase constant $\beta_i$, where $\omega_p=\omega_s+\omega_i$ and $\beta_p=\beta_s+\beta_{i'}$ said resonant circuit means sustaining said idler frequency whereby said idler frequency is maintained constant so that said signal frequency can be selectively tuned over a wide range with a minimum tuning range required of the pump frequency.

8. A tunable traveling wave parametric amplifier for amplifying a signal wave of frequency $\omega_s$ and phase constant $\beta_s$ by a mixing operation which converts power from a pump wave of frequency $\omega_p$ and phase constant $\beta_p$ comprising a multipath transmission line including a wave guide structure and an enclosed conductor in axial alignment with said wave guide structure, a plurality of transverse conductors coupled between the narrow dimension walls of said waveguide and substantially uniformly spaced along the length thereof, means for tuning said transverse conductors to a fixed frequency, a plurality of substantially uniformly spaced nonlinear reactance elements connected between said enclosed conductor and one end of said transverse conductors so as to be coupled to the electric fields of said enclosed conductor, said transverse conductors and said wave guide for periodically loading said transmission line, first means for coupling said pump wave to said wave guide to provide propagation of said pump wave through said wave guide, second means for coupling said signal wave to said enclosed conductor to provide propagation of said signal wave along said conductor, said signal and pump waves reacting across said nonlinear elements to provide an idler wave of frequency $\omega_i$ and phase constant $\beta_i$ where $\omega_p=\omega_s+\omega_i$ and $\beta_p=\beta_s+\beta_i$, said idler wave being sustained by said tuned transverse conductors, whereby said idler frequency is maintained constant so that the signal frequency may be selectively tuned over a wide range of frequencies with a minimum tuning range required of the pump frequency.

References Cited by the Examiner

UNITED STATES PATENTS

| | | | |
|---|---|---|---|
| 3,008,089 | 11/61 | Uhlir | 330—5 |
| 3,012,203 | 12/61 | Tien | 330—5 |
| 3,045,189 | 7/62 | Engelbrecht | 330—4.6 |
| 3,068,422 | 12/62 | Grabowski | 330—4.6 |
| 3,076,149 | 1/63 | Knechtli et al. | 330—4.6 |

OTHER REFERENCES

Conrad et al.: "Proceedings of the IRE," May 1960, pages 939–940.

Currie et al.: "Proceeding of the IRE," December 1960, pages 1960–1987.

Fisher: "Proceedings of the IRE," July 1960, pages 1227–1232.

Honey et al.: "IRE Transactions on Microwave Theory and Techniques," May 1960, pages 351–361.

Hsu: "1960 International Solid-State Circuits Conference—Digest of Technical Papers," February 1960, pages 91–92.

Reed: "IRE Transactions on Electron Devices," April 1959, pages 216–224.

ROY LAKE, *Primary Examiner.*

BENNETT G. MILLER, *Examiner.*